(12) United States Patent
Lim

(10) Patent No.: US 7,723,170 B2
(45) Date of Patent: May 25, 2010

(54) METHOD FOR FORMING TRANSISTOR OF SEMICONDUCTOR DEVICE USING DOUBLE PATTERNING TECHNOLOGY

(75) Inventor: Hee Youl Lim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 65 days.

(21) Appl. No.: 11/759,197

(22) Filed: Jun. 6, 2007

(65) Prior Publication Data

US 2008/0020557 A1    Jan. 24, 2008

(30) Foreign Application Priority Data

Jul. 20, 2006    (KR) .................. 10-2006-0067914

(51) Int. Cl.
*H01L 21/336* (2006.01)
(52) U.S. Cl. .................. 438/197; 438/589; 257/330; 257/E29.262; 257/E21.41; 257/E21.294; 430/5; 430/296; 430/394; 430/322; 716/19; 716/21
(58) Field of Classification Search ............. 257/330, 257/E29.262, E21.41
See application file for complete search history.

(56) References Cited

U.S. PATENT DOCUMENTS

| | | | | |
|---|---|---|---|---|
| 4,615,102 A | * | 10/1986 | Suzuki et al. | 438/172 |
| 4,961,194 A | * | 10/1990 | Kuroda et al. | 257/192 |
| 4,988,639 A | * | 1/1991 | Aomura | 438/427 |
| 5,352,550 A | * | 10/1994 | Okamoto | 430/5 |
| 5,397,731 A | * | 3/1995 | Takemura | 438/427 |
| 5,487,963 A | * | 1/1996 | Sugawara | 430/5 |
| 5,504,033 A | * | 4/1996 | Bajor et al. | 438/405 |
| 5,587,090 A | * | 12/1996 | Belcher et al. | 216/17 |
| 5,681,766 A | * | 10/1997 | Tserng et al. | 438/172 |
| 5,700,605 A | * | 12/1997 | Ito et al. | 430/5 |
| 5,747,377 A | * | 5/1998 | Wu | 438/444 |
| 5,856,049 A | * | 1/1999 | Lee | 430/5 |
| 5,866,280 A | * | 2/1999 | Ito et al. | 430/5 |
| 5,893,744 A | * | 4/1999 | Wang | 438/401 |
| 5,917,209 A | * | 6/1999 | Andoh | 257/284 |
| 5,963,816 A | * | 10/1999 | Wang et al. | 438/401 |
| 6,037,082 A | * | 3/2000 | Capodieci | 430/5 |
| 6,078,067 A | * | 6/2000 | Oikawa | 257/192 |
| 6,080,625 A | * | 6/2000 | Chittipeddi et al. | 438/259 |
| 6,159,641 A | * | 12/2000 | Baum et al. | 430/5 |
| 6,218,262 B1 | * | 4/2001 | Kuroi et al. | 438/401 |
| 6,222,210 B1 | * | 4/2001 | Cerny et al. | 257/194 |

(Continued)

FOREIGN PATENT DOCUMENTS

KR    1020040046702 A    6/2004

(Continued)

*Primary Examiner*—Fernando L Toledo
*Assistant Examiner*—Ankush K Singal
(74) *Attorney, Agent, or Firm*—Townsend and Townsend and Crew LLP

(57) ABSTRACT

A method for forming a transistor of a semiconductor device comprises: forming an isolation film over a semiconductor substrate to define an active region; forming a first recess in an active region (one side) between the isolation films; forming a second recess having the same size as that of the first recess in an active region (the other side) between the isolation film; and forming a gate for filling the first recess and the second recess.

14 Claims, 3 Drawing Sheets

U.S. PATENT DOCUMENTS

| | | | |
|---|---|---|---|
| 6,251,547 B1 * | 6/2001 | Tzu et al. | 430/5 |
| 6,440,816 B1 | 8/2002 | Farrow et al. | 438/401 |
| 6,489,083 B1 * | 12/2002 | Smith et al. | 430/313 |
| 6,569,581 B2 * | 5/2003 | Peng | 430/5 |
| 6,613,644 B2 * | 9/2003 | Lachner | 438/424 |
| 6,624,039 B1 * | 9/2003 | Abdelgadir et al. | 438/401 |
| 6,767,682 B1 * | 7/2004 | Schroeder | 430/312 |
| 6,770,535 B2 * | 8/2004 | Yamada et al. | 438/270 |
| 6,825,534 B2 * | 11/2004 | Chen et al. | 257/354 |
| 6,841,316 B2 * | 1/2005 | Crell | 430/5 |
| 6,855,604 B2 * | 2/2005 | Lee | 438/270 |
| 6,902,851 B1 * | 6/2005 | Babcock et al. | 430/5 |
| 6,979,651 B1 * | 12/2005 | Hellig et al. | 438/694 |
| 7,045,435 B1 * | 5/2006 | Liu | 438/427 |
| 7,220,655 B1 * | 5/2007 | Hause et al. | 438/424 |
| 7,316,963 B2 * | 1/2008 | Lee | 438/401 |
| 2003/0003376 A1 * | 1/2003 | Crell | 430/5 |
| 2004/0043306 A1 * | 3/2004 | Aoyama | 430/5 |
| 2004/0131949 A1 * | 7/2004 | Kurihara et al. | 430/5 |
| 2004/0262695 A1 * | 12/2004 | Steegan et al. | 257/371 |
| 2006/0019180 A1 * | 1/2006 | Nomura | 430/5 |
| 2006/0177743 A1 * | 8/2006 | Ishiwata | 430/5 |
| 2006/0240333 A1 * | 10/2006 | Hung et al. | 430/5 |
| 2007/0160919 A1 * | 7/2007 | Chen et al. | 430/5 |
| 2008/0173939 A1 * | 7/2008 | Shim | 257/330 |
| 2008/0217699 A1 * | 9/2008 | Disney et al. | 257/378 |

FOREIGN PATENT DOCUMENTS

| | | | |
|---|---|---|---|
| KR | 1020060060282 A | 6/2006 | |

* cited by examiner

METHOD FOR FORMING TRANSISTOR OF SEMICONDUCTOR DEVICE USING DOUBLE PATTERNING TECHNOLOGY

CROSS-REFERENCES TO RELATED APPLICATIONS

The present application claims priority to Korean patent application number 10-2006-0067914, filed on Jul. 20, 2006, which is incorporated by reference in its entirety.

BACKGROUND OF THE INVENTION

The present invention relates to a method for forming a transistor of a semiconductor device, and more specifically, to a method for forming a transistor having a recess gate using a double patterning technology to overcome the resolution limit of a photolithography process.

As the design rule becomes smaller, the current technology for manufacturing a semiconductor device represents a limit in resolution in a photolithography process by the design rule of 80 nm in a DRAM manufacturing process. In a pattern of 60 nm or less, an immersion process should be applied to several processes for forming various layers of a semiconductor device, which results in a requirement of expensive equipment.

A double patterning technology which is one of dry processes can be applied with the existing equipment to form a fine pattern.

As the integration of semiconductor devices increases, the channel length of transistors becomes shorter. As a result, a threshold voltage of the transistor becomes lower, which is called a short channel effect. In order to prevent the short channel effect, a recess is formed in a cell region of a semiconductor substrate, thereby obtaining a transistor having a recess gate so that the channel length may be longer.

SUMMARY OF THE INVENTION

Various embodiments of the present invention relate to a method for forming a transistor having a recess gate of a semiconductor device using a double patterning technology, thereby overcoming the resolution limit in a photolithography process.

According to an embodiment of the present invention, a method for forming a transistor of a semiconductor device comprises: forming an isolation film over a semiconductor substrate to define an active region; forming a first recess in one side of an active region between the isolation films; forming a second recess having substantially the same size as that of the first recess in another side of an active region between the isolation film; and forming a gate for filling the first recess and the second recess.

DETAILED DESCRIPTION OF THE SPECIFIC EMBODIMENT

The present invention relates to a method for forming a transistor of a semiconductor device. The method comprises the steps of: forming an isolation film over a semiconductor substrate to define an active region; forming a first recess in an active region (one side) between the isolation films; forming a second recess having the same size as that of the first recess in an active region (the other side) between the isolation film; and forming a gate for filling the first recess and the second recess.

The first recess and the second recess are formed with an exposure mask. The exposure mask is a gate mask designed to define one of two gate regions defined over the active region. The first recess and the second recess are formed by moving the exposure mask.

A first recess is formed with an exposure mask that defines the first recess, and a second recess is formed with an exposure mask that defines the second recess. Otherwise, a second recess is formed with an exposure mask that defines the second recess, and a first recess is formed with an exposure mask that defines the first recess.

The exposure mask that defines the first recess is a gate mask that defines one of two gate regions defined over the active region. The exposure mask that defines the second recess is a gate mask that defines the other of the two gate regions.

The first recess and the second recess are formed to have the minimum line-width depending on a limit resolution of a lithography process.

The isolation film, the first recess and the second recess are separated with the same interval from each other.

The forming-a-gate step further comprises: forming a gate insulating film over the resulting structure including the first recess and the second recess; filling a gate material in the first recess and second recess; and planarizing the resulting structure to expose the semiconductor substrate, thereby obtaining a gate.

The planarizing process is performed by a CMP process.

The forming-a-gate step further comprises: forming a gate insulating film over the resulting structure including the first recess and the second recess; filling a gate material in the first recess and the second recess; and patterning the gate material to form a gate.

The recess can be formed to have a finer interval by adjusting the usage number of a recess mask pattern.

FIGS. 1a through 1d are cross-sectional diagrams illustrating a method for forming a transistor having a recess using a double patterning technology according to an embodiment of the present invention.

A photoresist film (not shown) for short wavelength lithography is formed over a semiconductor substrate 10 including the first and second isolation films 11 and 12 with a width W1.

Figure 1A:
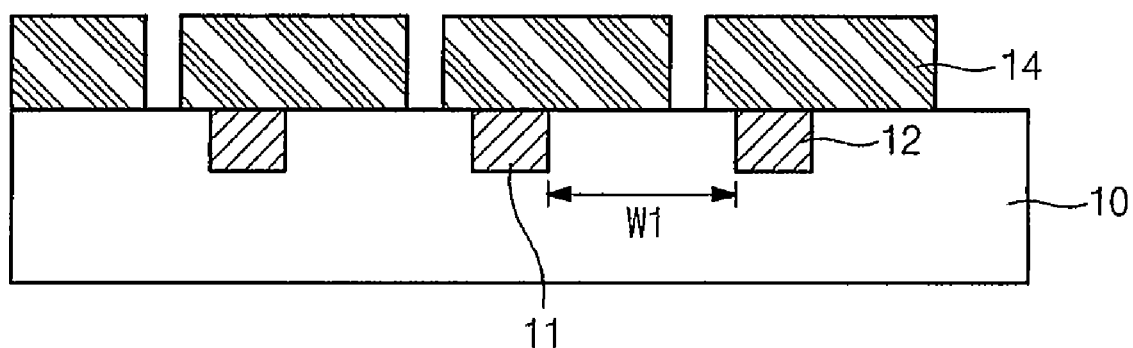
FIGS. 1a through 1e are cross-sectional diagrams illustrating a method for forming a transistor having a recess using a double patterning technology according to an embodiment of the present invention.
Figure 1B:
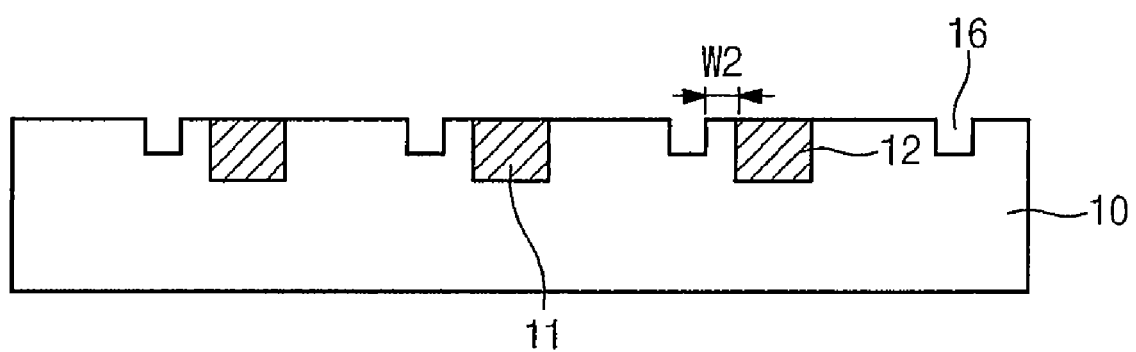
Figure 1C:
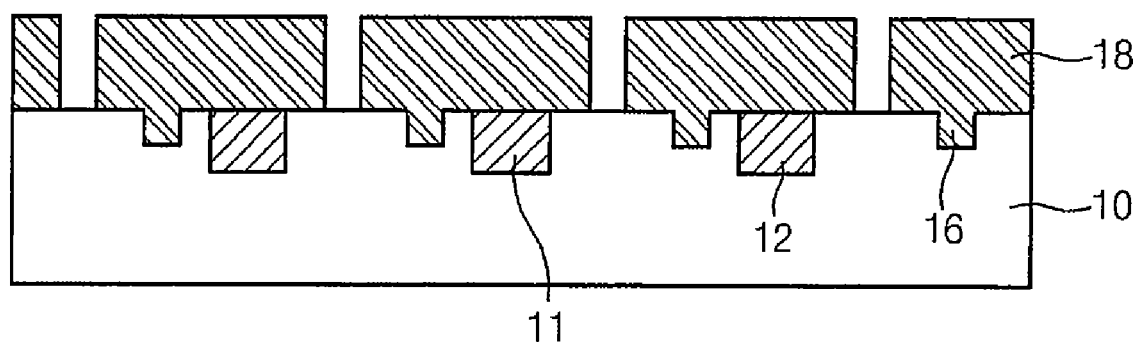
Figure 1D:
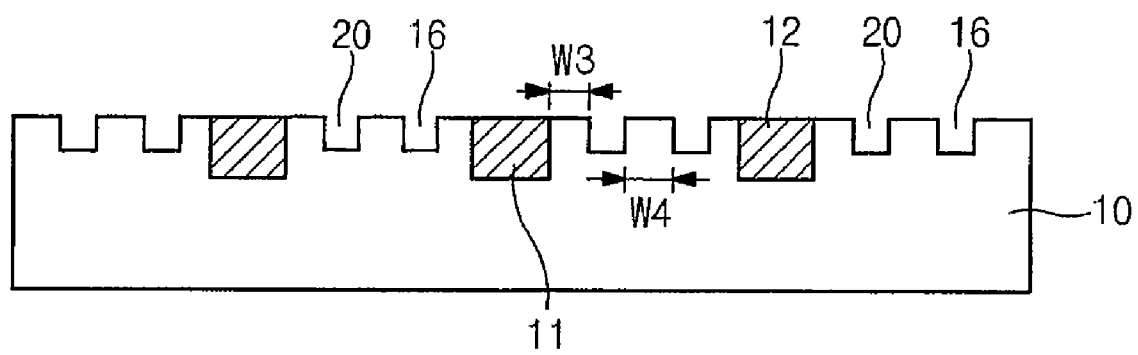
Figure 1E:
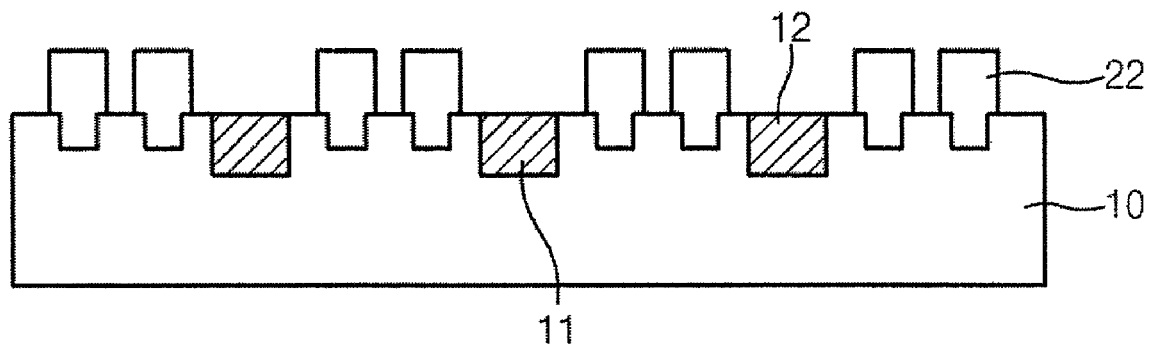

A photo process is performed with a first gate mask to form a first recess mask pattern 14 where a portion of an active region between the isolation films is open (see FIG. 1a).

The semiconductor substrate 10 is etched at a depth ranging from 500 to 2000 Å with the first recess mask pattern 14 as an etching barrier to form a first recess 16. The first recess mask pattern 14 is removed. The first recess 16 is separated from the second isolation film 12 with a width W2 (see FIG. 1b).

A photoresist material for short wavelength lithograph is coated over the resulting structure to form a photoresist film (not shown). A photo process is performed with a second gate mask on the photoresist film to form a second recess mask pattern 18 where a portion of the active region between the isolation films is open (see FIG. 1c).

The semiconductor substrate 10 is etched at a depth ranging from 500 to 2000 Å with the second recess mask pattern 18 as an etching barrier to form a second recess 20. The second recess mask pattern 18 is removed.

The second recess 20 is separated from the first isolation film 11 with a width W3. The first recess 16 is separated from the second recess 20 with a width W4 (see FIG. 1d). The separation widths W2, W3 and W4 are the same.

A gate insulating film (not shown) is formed over the semiconductor substrate 10 including the first recess 16 and the second recess 20. A gate material consisting of a silicon electrode (not shown) where n-type dopants such as P or As are doped by in-situ is formed over the resulting structure until the first recess 16 and the second recess 20 are filled.

The resulting structure is planarized by a Chemical Mechanical Polishing (CMP) process until the semiconductor substrate 10 is exposed, or the gate material is patterned to form a gate pattern.

The recess can be formed to have a finer interval by adjusting the usage number of a recess mask pattern.

As a result, due to the double patterning technology according to the present invention, the recess mask pattern can be formed to have a finer pitch size, thereby overcoming the resolution limit of the current exposer. Also, the recess can be formed by simplified process with the two steps.

As described above, a double patterning technology according to an embodiment of the present invention is applied to patterning of a recess gate which has a resolution limit in a photolithography process, thereby overcoming process limits without additional cost resulting from an immersion process and without shrinking of a photoresist to improve reliability of electric characteristics.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a transistor of a semiconductor device, the method comprising:
    forming an isolation film within a semiconductor substrate to define an active region;
    forming a first recess in the active region by selectively etching the semiconductor substrate with an exposure mask;
    forming a second recess in the active region by moving the exposure mask for selectively etching the semiconductor substrate, wherein the second recess is substantially the same size as the first recess, the second recess being formed next to and at the same level and depth as the first recess; and
    forming a gate for filling the first recess and the second recess.

2. The method according to claim 1, wherein the first recess and the second recess are formed with an exposure mask.

3. The method according to claim 1, wherein the first recess is formed with an exposure mask designed to define one of two gate regions defined over the active region.

4. The method according to claim 1, wherein the first recess is formed with a first exposure mask that defines the first recess, and the second recess is formed with a second exposure mask that defines the second recess.

5. The method according to claim 1, wherein the isolation film is formed at a greater depth in the semiconductor substrate than the first and the second recesses.

6. The method according to claim 1, wherein the isolation film, the first recess and the second recess are separated with the same interval from each other.

7. The method according to claim 1, wherein the first recess and the second recess are formed at a depth ranging from 500 to 2000 Å.

8. The method according to claim 1, wherein the forming-a-gate step further comprises:
    forming a gate insulating film over the resulting structure including the first recess and the second recess;
    filling a gate material in the first recess and second recess; and
    planarizing the resulting structure to expose the semiconductor substrate, thereby obtaining a gate.

9. The method according to claim 1, wherein the forming-a-gate step further comprises:
    forming a gate insulating film over the resulting structure including the first recess and the second recess;
    filling a gate material in the first recess and the second recess; and
    patterning the gate material to form a gate.

10. The method according to claim 2, wherein the first recess and the second recess are formed to have the minimum line-width depending on resolution limit of a lithography process.

11. The method according to claim 3, wherein the second recess is formed with the exposure mask to define the other of the two gate regions.

12. The method according to claim 4, wherein the first exposure mask that defines the first recess is a gate mask that defines one of two gate regions defined over the active region.

13. The method according to claim 4, wherein the second exposure mask that defines the second recess is a gate mask that defines the other of the two gate regions.

14. The method according to claim 8, wherein the planarizing process is performed by a chemical mechanical polishing (CMP) process.

* * * * *